US012588486B2

(12) United States Patent
Loh et al.

(10) Patent No.: US 12,588,486 B2
(45) Date of Patent: Mar. 24, 2026

(54) CONNECTING SEMICONDCUTOR DEVICE ASSEMBLY COMPONENTS USING INTERCONNECT DIES WITH SPACER COMPONENT COUPLED TO A PORTION OF AN INTERCONNECT DIE

(71) Applicant: ADVANCED MICRO DEVICES, INC., Santa Clara, CA (US)

(72) Inventors: Gabriel H. Loh, Bellevue, WA (US); Raja Swaminathan, Austin, TX (US); Rahul Agarwal, Livermore, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 575 days.

(21) Appl. No.: 17/896,616

(22) Filed: Aug. 26, 2022

(65) Prior Publication Data

US 2024/0071903 A1 Feb. 29, 2024

(51) Int. Cl.
*H01L 23/522* (2006.01)
*H01L 23/16* (2006.01)
*H01L 23/528* (2006.01)

(52) U.S. Cl.
CPC .......... *H01L 23/5226* (2013.01); *H01L 23/16* (2013.01); *H01L 23/528* (2013.01)

(58) Field of Classification Search
CPC ... H01L 23/5226; H01L 23/16; H01L 23/528; H01L 25/0652; H01L 26/0655; H01L 23/3171; H01L 23/42; H01L 23/552; H01L 23/3178
See application file for complete search history.

(56) References Cited

U.S. PATENT DOCUMENTS

| | | | |
|---|---|---|---|
| 7,969,009 B2 | 6/2011 | Chandrasekaran | |
| 9,941,253 B1 | 4/2018 | Jung et al. | |
| 11,127,776 B2 | 9/2021 | De Amicis et al. | |
| 11,830,817 B2 | 11/2023 | Agarwal et al. | |
| 2006/0264022 A1* | 11/2006 | Sugimura | H01L 21/563 257/737 |
| 2007/0181991 A1 | 8/2007 | Ishino et al. | |

(Continued)

FOREIGN PATENT DOCUMENTS

| | | |
|---|---|---|
| JP | 2013175772 A | 9/2013 |
| JP | 2019047043 A | 3/2019 |

(Continued)

OTHER PUBLICATIONS

International Search Report and Written Opinion, PCT/US2021/045734, Dec. 1, 2021, 11 pages.
U.S. Appl. No. 17/896,616, filed Aug. 26, 2022, Gabriel H. Loh.

*Primary Examiner* — Galina G Yushina

(57) ABSTRACT

A semiconductor package assembly includes a die having a front surface and a back surface opposite to and parallel to the front surface. A first portion of a front surface of an interconnect die is coupled to a portion of the back surface of the die. The interconnect die includes a connectivity region that is coupled to one or more through-die vias in the die through the back surface of the die. A spacer component is coupled to a second portion of the front surface of the interconnect die. The spacer component includes conductive connections, with one or more of the conductive connections are coupled to the conductive pathways of the connectivity region of the interconnect die.

17 Claims, 3 Drawing Sheets

(56)　　　　　　References Cited

U.S. PATENT DOCUMENTS

| | | | |
|---|---|---|---|
| 2009/0321939 A1 | 12/2009 | Chandrasekaran | |
| 2011/0215472 A1 | 9/2011 | Chandrasekaran | |
| 2013/0187292 A1 | 7/2013 | Semmelmeyer et al. | |
| 2018/0138146 A1 | 5/2018 | Cheah et al. | |
| 2019/0181118 A1* | 6/2019 | Chew | H01L 21/565 |
| 2019/0385977 A1 | 12/2019 | Elsherbini et al. | |
| 2020/0075545 A1 | 3/2020 | Kim et al. | |
| 2020/0211970 A1 | 7/2020 | Gomes et al. | |
| 2020/0273799 A1 | 8/2020 | Sung et al. | |
| 2020/0395309 A1 | 12/2020 | Cheah et al. | |
| 2021/0028152 A1 | 1/2021 | Lee et al. | |
| 2021/0066255 A1* | 3/2021 | Chen | H01L 21/565 |
| 2021/0066279 A1 | 3/2021 | Yu et al. | |
| 2021/0082825 A1 | 3/2021 | Strong et al. | |
| 2021/0159211 A1 | 5/2021 | Rubin et al. | |
| 2021/0193616 A1* | 6/2021 | Cheah | H01L 23/5384 |
| 2021/0249430 A1* | 8/2021 | Fulford | H10B 41/27 |
| 2022/0051985 A1 | 2/2022 | Agarwal et al. | |
| 2024/0071940 A1 | 2/2024 | Agarwal et al. | |

FOREIGN PATENT DOCUMENTS

| | | | |
|---|---|---|---|
| JP | 2020520562 A | 7/2020 | |
| WO | 2022036090 A1 | 2/2022 | |

* cited by examiner

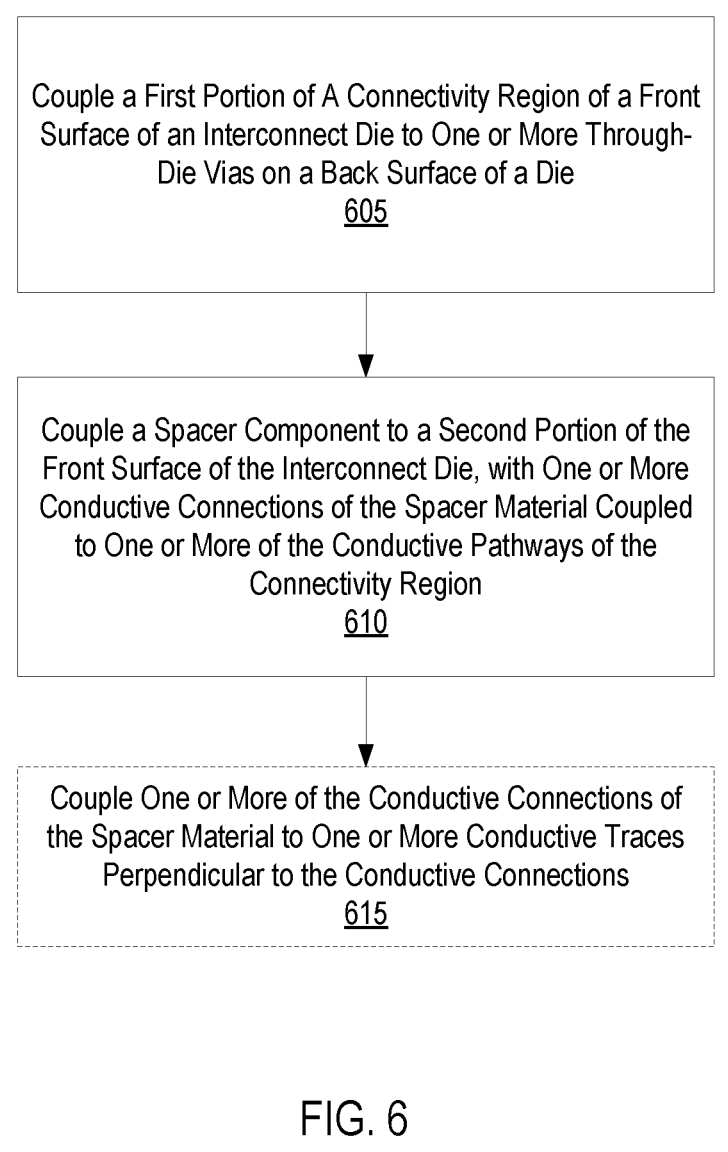

Couple a First Portion of A Connectivity Region of a Front Surface of an Interconnect Die to One or More Through-Die Vias on a Back Surface of a Die
605

Couple a Spacer Component to a Second Portion of the Front Surface of the Interconnect Die, with One or More Conductive Connections of the Spacer Material Coupled to One or More of the Conductive Pathways of the Connectivity Region
610

Couple One or More of the Conductive Connections of the Spacer Material to One or More Conductive Traces Perpendicular to the Conductive Connections
615

FIG. 6

CONNECTING SEMICONDCUTOR DEVICE ASSEMBLY COMPONENTS USING INTERCONNECT DIES WITH SPACER COMPONENT COUPLED TO A PORTION OF AN INTERCONNECT DIE

BACKGROUND

Increasing numbers of components are interconnected in semiconductor assemblies. To connect different components, some semiconductor assemblies include conductive traces parallel to a substrate on to which the components are coupled. Such conductive traces, in some variations, are above a surface of the substrate itself. While this elevation of the conductive traces above the substrate simplifies fabrication, use of such elevated conductive traces blocks power delivery to portions of a system on chip, or a die, that is coupled to the elevated conductive traces.

BRIEF DESCRIPTION OF THE DRAWINGS

FIG. 6 is a flow chart illustrating an example method for manufacturing an integrated circuit device including a die that is coupled to an interconnect die that is coupled to a spacer component according to some implementations.

DETAILED DESCRIPTION

As semiconductor technologies further advance, stacked semiconductor devices (e.g., three dimensional integrated circuits (3DICs)), have emerged as an effective alternative to further reduce the physical size of semiconductor devices. In a stacked semiconductor device, active circuits such as logic, memory, processor circuits, and the like are fabricated on different semiconductor dies. Two or more semiconductor dies may be installed or stacked on top of one another to further reduce the form factor of the semiconductor device. Different die may be connected using conductive traces that are elevated above a substrate. While using such elevated conductive traces simplifies device fabrication, coupling a die to a conductive trace elevated above a substrate blocks the portion of the die coupled to the conductive trace from receiving power or other signals from beneath the substrate.

Figure 1:
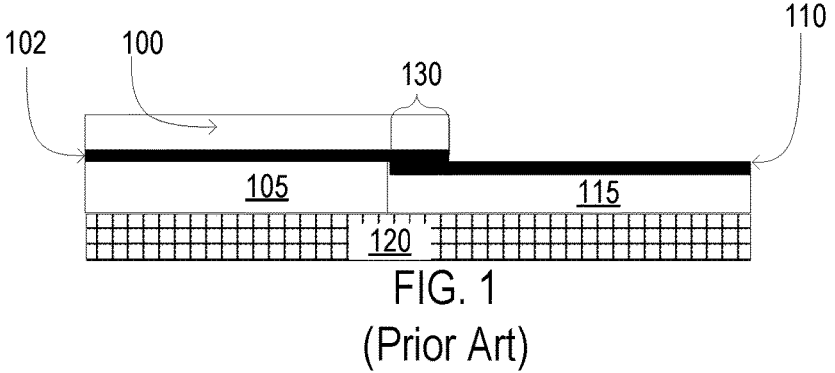
FIG. 1 shows a cross-section of a conventional semiconductor assembly coupling a die to an elevated conductive trace.

FIG. 1 shows a cross-section of a conventional semiconductor assembly coupling a die 100 to an elevated conductive trace 110. In the example of FIG. 1, a mold layer 105 couples the die 100 to a substrate 120. The die 100 includes one or more connection layers 102. In some examples, the connection layers 102 include layers of metallization and interlevel dielectric material, as well as conductive structures such as vias, traces, and pads. In these examples, the one or more connection layers 102 form connections between the circuit components composed in the die. In the conventional semiconductor assembly shown in FIG. 1, the elevated conductive trace 110 is positioned on top of a layer 115 of silicon or other material, with the layer 115 raising the elevated conductive trace 110 above a surface of the substrate 120. The elevated conductive trace 110 is positioned below a portion 130 of a surface of the die 100 nearest to the substrate 120 so one or more connection layers 102 of the die 100 contact one or more portions of the elevated conductive trace 110 to couple the die 100 to the elevated conductive trace 110. While this allows the elevated conductive trace 110 to be coupled to the die 100, this positioning causes the elevated conductive trace 110 and the layer 115 to block the one or more connection layers 102 included in the portion 130 of the die 100 from contacting the substrate 120. This blockage of the portion 130 of the die 100 from the substrate 120 impairs power delivery from the die 100 to other components coupled to the die 100, as delivering power (or other signals) laterally across the die 100 via the one or more connection layers 102 to be directed to other components by the elevated conductive trace 110 increases difficulty in providing power to other components (e.g., memory) connected to the die 100 using the elevated conductive trace 110 elevated above the substrate 120. Although modifying elevated conductive traces 110 to include through vias (e.g., through silicon vias) allows connections from below the substrate 120 to pass through the elevated conductive traces, such a modification increases fabrication complexities due to the inclusion of the through vias during fabrication.

To that end, the present specification sets forth various implementations of a semiconductor device enabling a die to be coupled to one or more other components without obstructing a portion of a front surface of the die. A portion of the back surface of the die is coupled to a first portion of a front surface of an interconnect die, while a second portion of the interconnect die is coupled to a spacer component including conductive connections that are generally perpendicular to the front surface of the interconnect die. Variations of such a semiconductor device assembly include a die having a front surface and a back surface opposite to and parallel to the front surface. The semiconductor device assembly also includes an interconnect die, where a first portion of a front surface of the interconnect die is coupled to a portion of the back surface of the die, and the interconnect die includes a connectivity region having conductive pathways parallel to the back surface of the die, the connectivity region coupled to one or more through-die vias in the die through the back surface of the die. A spacer component is coupled to a second portion of the front surface of the interconnect die. The spacer component includes conductive connections perpendicular to the connectivity region of the interconnect die, with the conductive connections coupled to the conductive pathways of the connectivity region of the interconnect die. In various implementations, the front surface of the die is configured to be coupled to a substrate and the front surface of the die is not obstructed by the interconnect die.

In some implementations, the semiconductor device assembly further includes a conductive trace layer including plurality of conductive traces included in a dielectric material. In some implementations, the conductive trace layer does not include at least one active component. The plurality of conductive traces are perpendicular to the conductive connections of the spacer component and are coupled to one or more of the conductive connections of the spacer component. A component is coupled to the plurality of conductive traces in some implementations. For example, the component is a memory in some implementations.

In some implementations, the semiconductor assembly further includes an additional die having an additional front surface and an additional back surface parallel to and opposite to the additional front surface, with the spacer material contacting the additional back surface of the additional die and one or more conductive portions of the additional die coupled to one or more of the conductive connections of the spacer component. The additional die has a height that is less than a height of the die in some implementations. In some implementations, the additional die has a different temperature constraint than the die.

Further, in some implementations, the semiconductor device includes an additional spacer component including additional conductive connections perpendicular to the plurality of conductive traces, where one or more of the additional conductive connections are coupled to one or more conductive traces of the plurality of conductive traces. An additional interconnect die having an additional connectivity region including additional conductive pathways perpendicular to the additional conductive connections, with one or more of the additional conductive pathways coupled to one or more of the additional conductive connections. One or more through-die vias in an additional die, having an additional front surface and an additional back surface parallel to and opposite to the additional front surface, couple a portion of the additional back surface to one or more of the additional conductive pathways of the additional connectivity region of the additional interconnect die in some implementations. In some implementations, the spacer component has a thickness based on a distance between the front surface of the interconnect die and a surface of the plurality of conductive traces.

In some implementations, the spacer component comprises silicon. The conductive connections comprise through silicon vias in some implementations. In some implementations, the spacer component comprises a dielectric material. The spacer component does not include at least one active component in various implementations.

The present specification also describes a method for forming a semiconductor assembly that couples a first portion of a connectivity region of a front surface of an interconnect die to one or more through-die vias on a back surface of a die, the back surface of the die opposite to and parallel to a front surface of the die, and the connectivity region having conductive pathways parallel to the back surface of the die. The method further couples a spacer component to a second portion of the front surface of the interconnect die, where the spacer component includes conductive connections perpendicular to the conductive pathways of the connectivity region and one or more of the conductive connections are coupled to one or more of the conductive pathways of the connectivity region of the interconnect die.

In some implementations, the method further couples one or more of the conductive connections of the spacer component to one or more conductive traces perpendicular to the conductive connections, where the one or more conductive traces included are a layer comprising a dielectric material. In some implementations, the method further couples a component to at least a set of the conductive traces. The component is a memory in some implementations. In some implementations, the spacer component has a thickness based on a distance between the front surface of the interconnect die and a surface of the plurality of conductive traces.

The following disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows include implementations in which the first and second features are formed in direct contact, and also include implementations in which additional features formed between the first and second features, such that the first and second features are in direct contact. Further, spatially relative terms, such as "beneath," "below," "lower," "above," "upper," "back," "front," "top," "bottom," and the like, are used herein for ease of description to describe one element or feature's relationship to another element(s) or feature(s) as illustrated in the figures. Similarly, terms such as "front surface" and "back surface" or "top surface" and "back surface" are used herein to more easily identify various components, and identify that those components are, for example, on opposing sides of another component. The spatially relative terms are intended to encompass different orientations of the device in use or operation in addition to the orientation depicted in the figures.

Figure 2:
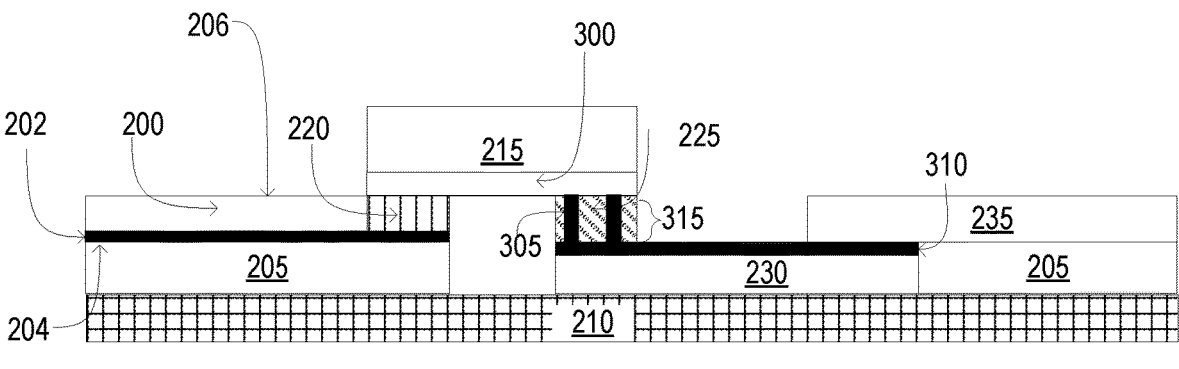
FIG. 2 is a cross-sectional view of a semiconductor assembly including a die that is coupled to an interconnect die that is coupled to a spacer component according to some implementations.

FIG. 2 is a cross-sectional view of a semiconductor assembly including a die 200 that is coupled to an interconnect die 215 that is coupled to a spacer component 225. In various implementations, the die 200 implements one or more component functions for a system on chip (SoC). A mold layer 205 couples the die 200 to a substrate 210 in the implementation shown in FIG. 2. However, in other implementations, the mold layer 205 couples the die 200 to a wafer, to a card, or to another suitable component. One or more through-mold vias provide conductive paths that couple power and ground from the substrate 210 to the die 200. One of more of the through-mold vias convey input signals, output signals, or other signals to and from the die 200 via the substrate 210 in various implementations.

In various implementations, the die 200 includes a die substrate comprising a bulk suitable material (e.g., silicon, germanium, or gallium derivatives) and device layers typically fabricated by sequentially depositing insulating or dielectric layers, conductive layers, and semiconductive layers of material over the semiconductor bulk, and patterning the various material layers using photolithography and photomasking to form circuit components and elements (e.g., transistors, capacitors, resistors, etc.). In these examples, the circuit components may be connected to form integrated circuits that implement a functional circuit block of the die 100, such as a processor, interface, memory, or other system component.

Additionally, the die 200 includes one or more connection layers 202. In some examples, the connection layers 202 include layers of metallization and interlevel dielectric material, as well as conductive structures such as vias, traces, and pads. In these examples, the one or more connection layers 202 form connections between the circuit components composed in the die substrate to implement the functional circuit blocks of the die 200. For example, the one or more connection layers 202 implement a die-level redistribution layer structure created during the die fabrication process, such as a back end of line (BEOL) structure. In the fabrication process, interconnects may be created with very fine line/space pitches of less than 1 µm, thus allowing for high density connections. In these examples, the one or more connection layers also include bonding sites to which metal connectors (e.g., die pads, microbumps, Controlled Collapse Chip Connection (C4) bumps) may be attached, either during the fabrication process or in a post-fabrication process such as die packaging. In various implementations, the one or more connection layers 202 are near a front surface 204 of the die 200. In some implementations, the front surface 204 of the die 200 is nearest to the substrate 210 or nearest to a component to which the die 200 is coupled. The die 200 also includes a "back surface" 206 that is parallel to the front surface 204 and is opposite to the front surface 204. Additionally, the back surface 206 of the die 200 comprises bulk material without the one or more connection layers 202.

In the example shown by FIG. 2, a first portion of the interconnect die 215 is coupled to the die 200. In various implementations, a first portion of a front surface 204 of the interconnect die 215 is coupled to a portion of the back surface of the die 200. The "back surface" 206 of the die 200 is opposite to and parallel to the front surface 204 of the die, as described above. In some implementations, the back surface 206 of the die 200 is a surface of the die 200 that is farthest from the one or more connection layers 202, as described above. The "front surface" of the interconnect die 215 is a surface of the interconnect die 215 that is nearest to the die 200 in various implementations. The interconnect die 215 includes a connectivity region 300 proximate to the front surface of the interconnect die 215. The connectivity region 300 includes conductive pathways that are parallel to back surface 206 of the die 200. In various implementations, the conductive pathways comprise layers of metallization and interlevel dielectric material, as well as conductive structures such as vias, traces, and pads. In some examples, as shown in FIG. 2, the interconnect die 215 is face-to-back (F2B) bonded to the die 200 through various bonding techniques such as hybrid bonding, thermocompression bonding, solder reflow, and other techniques. However, it is further contemplated that the interconnect die 215 may be face-to-face (F2F) bonded to the die 200 through various bonding techniques such as hybrid bonding, thermocompression bonding, solder reflow, and other techniques.

The first portion of the connectivity region 300 of the interconnect die 215 is coupled to one or more through-die vias 220 in the die 200. The connectivity region of the interconnect die 215 is coupled to the one or more through-die vias 220 through the back surface 206 of the die 200. As shown in FIG. 1, the die 200 includes a portion having multiple through-die vias 220 that provide connection from one or more connection layers 202 of the die 200, or from the front surface 204 of the die 100, to the back surface 206 of the die 200. Hence, the through-die vias 220 provide signals (and power and ground) on one face of the die 200 to an opposing face of the die 200 for interconnection to another component. In some examples, the back surface 206 of the die 200 may include a redistribution layer (not shown) that includes a metallization layer or multiple levels of metallization and dielectric layers that is created on the back surface of the die for connecting the through-die vias 220 to another component. In some examples, the through-die vias 220 are fabricated before device layers (transistors, capacitors, resistors, etc.) are patterned onto the die 200. In some examples, the through-die vias 220 are fabricated after the individual devices are patterned but before the one or more connection layers are created on the die 200. In some examples, the through-die vias 220 are fabricated after (or during) the fabrication of the one or more connection layers.

After formation, the through-die vias 220 may be selectively filled or plated with conductive material (e.g., copper) to create interconnects. In some examples, the through-die vias 220 are essentially metal insulator semiconductor (MIS) devices in which a dielectric layer SiO2 is deposited for the electrical isolation between a conducting metal and a silicon substrate. In some examples, the diameter of the through-die vias 220 is less than 10 µm. In some examples, the through-die vias 220 are buried, such that the bulk of the substrate is be ground or etched away to expose a through-die via 220. The through-die vias 220 provide high density, short channel, wide interconnects useful for die partitioning and die stacking. In some implementations, one or more of the through-die vias 220 are coupled to one or more of the connection layers 202 of the die.

In some implementations, the interconnect die 215 is an inactive bridge die that includes metallization layers and dielectric layers in the connectivity region 300 but does not include active device layers that implement logic functions. The connectivity region 300 is configured to create interconnections between one or more through-die vias 220 interfaces on the back surface 206 of the die 200. For example, the connectivity region 300 may be etched or modified to create conductive pathways.

In some implementations, the interconnect die 215 is an active bridge die that includes metallization layers and dielectric layers in the connectivity region 300 as well as logic for routing connections to or from the die 200 coupled to the interconnect die 215. The connectivity region 300 is configured to create interconnections between the one or more through-die vias 220 on the back surface 206 of the die 200. For example, the connectivity region may be etched or modified to create conductive pathways.

In some implementations, the interconnect die 215 is a system on chip (SoC) die, like the die 200, with the interconnect die 215 including metallization layers and dielectric layers in the connectivity region as well as functional circuit blocks in a substrate of the interconnect die 215 for implementing an SoC component. In such an implementation, the interconnect die 215 is essentially an SoC die, like die 200, but are additionally configured with redistribution layer structures and/or logic for creating interconnections between the through-die via 220 interfaces on the back surfaces of the die 200. For example, the connectivity region 300 may be etched to create conductive pathways.

As shown in FIG. 2, a spacer component 225 is coupled to a second portion of the front surface of the interconnect die 215. The spacer component 225 is silicon in some implementations, while in other implementations, the spacer component 225 is a dielectric material. The spacer component 225 does not include at least one active component in various implementations. In various implementations, the spacer component 225 is coupled to an end of the front surface of the interconnect die 215 that is opposite an end of the interconnect die 215 to which the die 200 is coupled. Additionally, the spacer component 225 includes conductive connections 305 that are generally perpendicular to the connectivity region 300 of the interconnect die 215. One or more of the conductive connections 305 of the spacer component 225 are coupled to one or more of the conductive pathways of the connectivity region of the interconnect die 215. In various implementations, the conductive connections 305 of the spacer component 225 are through vias in the spacer component 225. In some implementations, the through vias are selectively filled or plated with conductive material (e.g., copper) to create interconnects.

The spacer component 225 includes conductive connections 305 that extend through a thickness 315 of the spacer component 225. The thickness 315 of the spacer component 225 is based on a distance between the front surface of the interconnect die 215 and a surface of a component to which the spacer component 225 is coupled. In the example shown by FIG. 2, the thickness 315 of the spacer component 225 is based on a distance between the front surface of the interconnect die 215 and an upper surface of the conductive trace layer 230. For example, the spacer component 225 has a thickness 315 that equals the distance between a topmost surface of the conductive trace layer 230 that is parallel to the interconnect die 215 and the front surface of the interconnect die 215. As another example, the spacer component 225 has a thickness 315 that is within a threshold amount of the distance between the topmost surface of the conductive trace layer 230 that is parallel to the front surface of the interconnect die 215 and the front surface of the interconnect die 215. In other implementations, the thickness 315 of the spacer component 225 is based on a distance between a topmost surface of the conductive trace layer 230 that is proximate to the conductive traces 310 (or that includes the conductive traces 310) and the front surface of the interconnect die 215. Hence, the thickness 315 of the spacer component 225 is capable of being customized for different implementations to account for different distances between the front surface of the interconnect die 215 and a surface of a component to which the interconnect die 215 is to be coupled.

The semiconductor assembly shown in FIG. 2 also includes a conductive trace layer 230 that includes one or more conductive traces 310, or a plurality of conductive traces 310, coupled to a surface of the substrate 210. The conductive traces are generally perpendicular to the conductive connections 305 of the spacer component 225 and are parallel to the substrate 210. In various implementations, the conductive trace layer 230 includes one or more layers of silicon or another dielectric material without active components and including the one or more conductive traces 310. For example, the silicon or other dielectric material including the conductive traces does not include at least one active component in various implementations. In other implementations, the conductive trace layer 230 includes one or more layers of silicon or another dielectric material, the one or more conductive traces 310, and one or more active components. Thus, the plurality of conductive traces 310 are elevated above a surface of the substrate 210 that is nearest to the die 200. The conductive traces 310 comprise layers of metallization and interlevel dielectric material, as well as conductive structures such as vias, traces, and pads in various implementations. A topmost surface of the conductive trace layer 230 that is parallel to the substrate 210 (or to another component) is separated from the front surface of the interconnect die 215 by a distance in various implementations, with the spacer component 225 having a thickness that is based on the distance, as further described below in conjunction with FIG. 3. An example of the conductive trace layer 230 is elevated fan-out bridge (EFB) technology provided by AMD.

One or more conductive traces 310 of the conductive trace layer 230 are coupled to one or more of the conductive connections 305 of the spacer component 225. For example, a pad of a conductive connection 305 of the spacer component 225 is coupled to a conductive trace 310 of the conductive trace layer 230. This electrically couples one or more conductive traces 310 of the conductive trace layer 230 to one or more conductive connections 305 of the spacer component 225.

Additionally, at least a set of the conductive traces 310 of the conductive trace layer 230 are coupled to a component 235 of the semiconductor assembly. In various implementations, the component 235 is coupled to an end of the conductive trace layer 230 that is opposite to an additional end of the conductive trace layer 230 that is coupled to the spacer component 225. Different components 235 are coupled to the one or more conductive traces of the conductive trace layer 230 in various implementations. In one example, the component 235 is a memory, such as a high bandwidth memory. In various implementations, the component 235 includes connection layers. In some examples, the connection layers include layers of metallization and interlevel dielectric material, as well as conductive structures such as vias, traces, and pads. In these examples, the one or more connection layers form connections between the circuit components composed in the component 235 to implement the functional circuit blocks of the component 235. For example, the one or more connection layers implement a die-level redistribution layer structure created during the die fabrication process, such as a back end of line (BEOL) structure. Additionally, one or more of the connection layers of the component 235 are coupled to one or more conductive traces 310 of the conductive trace layer 230. In the example shown by FIG. 2, the component 235 is coupled to a mold layer 205 that couples the component 235 to the substrate 210 or couples the component 235 to a wafer, to a card, or to another suitable component. One or more through-mold vias provide conductive paths that couple power and ground from the substrate 210 to the component 235. One or more of the through-mold vias convey input signals, output signals, or other signals to and from the component 235 via the substrate 210 in various implementations.

As shown in FIG. 2, coupling the die 200 to the conductive trace layer 230 using the interconnect die 215 and the spacer component 225 allows the front surface 204 of the die 200 to remain unobstructed by the conductive trace layer 230. This configuration simplifies delivery of power, ground, and other signals to the die 200 via the front surface 204 of the die 200, while allowing the die 200 to leverage the conductive trace layer 230 to connect to other components 235. The spacer component 225 coupled to the second portion of the interconnect die 215 offsets for a height difference between the back surface of the die 200 and a topmost surface of the conductive trace layer 230 to allow the connection between the die 200 and the conductive trace layer 230. While FIG. 2 shows an implementation where the die 200 is connected to the conductive trace layer 230 through the interconnect die 215 and the spacer component 225, in other implementations, the die 200 is connected to another component using the interconnect die 215 and the spacer component 225, allowing the die to be connected to components having different heights than the die 200 (e.g., components having connections that are lower than the back surface of the die 200) or having different temperature constraints than the die 200. Hence, the semiconductor assembly in FIG. 2 shows a chip-on-wafer lateral ("COW-L") configuration as the interconnect die 215 is positioned on both the die 200 and the conductive trace layer 230, rather than the interconnect die 215 being positioned on to of a single component in a chip-on wafer vertical ("COW-V") configuration.

Thus, the semiconductor assembly shown in FIG. 2 allows the front surface 204 of the die 200 to remain unobstructed for receiving power, ground, or other signals, improving power distribution to the die 200, as well as power distribution from the die 200 to other components. For example, the front surface 204 of the die 200 is configured to be coupled to a substrate, so the configuration described in conjunction with FIG. 2 results in the front surface 204 of the die 200 not being at least partially obstructed by the interconnect die 215, simplifying coupling of the front surface 204 of the die 200 to the substrate. Coupling a first portion of the interconnect die 215 to one or more through-die vias 220 of the die 200, while coupling a second portion of the interconnect die 215 to the spacer component 225 allows the spacer component 225 to offset a height differential from the back surface of the die 200. Coupling one or more conductive connections 305 in the spacer component 225 to one or more conductive pathways of the connectivity region 300 of the interconnect die 215 allows signals to be distributed from the die 200 through the connectivity region 300 of the interconnect die to the conductive connections 305 of the spacer component 225, which, in turn, distributes the signals to one or more other components coupled to the conductive connections 305. While FIG. 2 shows an implementation where the conductive connections 305 of the spacer component 225 are also coupled to conductive traces 310 of the conductive trace layer 230, in other implementations, other components are capable of being coupled to the conductive connections 305 of the spacer component 225 to be coupled to the die through the spacer component 225 and the interconnect die 215.

While FIG. 2, shows the die 200 coupled to a conductive trace layer 230 using the interconnect die 215, in other implementations the interconnect die 215 connects the die 200 to other components. For example, the die 200 is coupled to the interconnect die 215, as further described above in conjunction with FIG. 2, with the spacer component 225 coupled to the interconnect die 215 as further described above in conjunction with FIG. 2, and the spacer component 225 coupled to an additional die. The additional die has a height less than a height of the die 200 in some implementations. In other implementations, the additional die has one or more different temperature constraints than the die 200. The additional die has an additional front surface and an additional back surface parallel to and opposite to the additional front surface. One or more conductive connections 305 of the spacer component 225 are coupled to one or more conductive portions of the additional die. For example, one or more conductive connections 305 of the spacer component 225 are coupled to one or more through-die vias of the additional die (similar to the through-die vias of the die 200, further described above in conjunction with FIG. 2). In other examples, one or more conductive connections 205 of the spacer component 225 are coupled to one or more connection layers of the additional die; in some implementations, the one or more connection layers of the additional die are near the back surface of the additional die. Thus, in various implementations, the spacer material contacts the back surface of the additional die so one or more conductive connections 305 of the spacer component 225 are coupled to one or more conductive components of the additional die.

Figure 3:
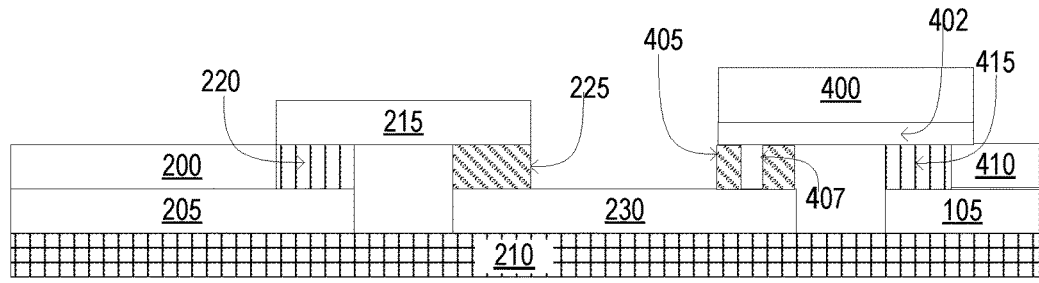
FIG. 3 is a cross-sectional view of a semiconductor assembly including an interconnect die coupled to a die and to a spacer component and an additional interconnect die coupled to an additional spacer component and to an additional die according to some implementations.

FIG. 3 is a cross-sectional view of a semiconductor assembly including an interconnect die 215 coupled to a die 200 and to a spacer component 225 and an additional interconnect die 400 coupled to an additional spacer component 405 and to an additional die 410. In the implementation shown by FIG. 3, a die 200 includes one or more through-die vias 220 extending through the die 200 from a front surface to a back surface that is parallel to and opposite to the front surface. In the implementation shown in FIG. 3, the front surface of the die 200 is coupled to a surface of a mold layer 205, with an opposite surface of the mold layer 205 coupled to a substrate 210 (in other implementations, the opposite surface of the mold layer 205 is coupled to a wafer, to a card, or to another suitable component), as further described above in conjunction with FIG. 2.

A first portion of a front surface of an interconnect die 215 is coupled to a portion of the back surface of the die 200 so one or more of the through die-vias 220 are coupled to one or more conductive pathways in a connectivity region 300 of the interconnect die 215. The conductive pathways in the interconnect die 215 are parallel to the back surface of the die 200, as further described above in conjunction with FIGS. 2 and 3. A second portion of the front surface of the interconnect die 215 is coupled to a spacer component 225 that includes one or more conductive connections 305, as further described above in conjunction with FIG. 2. The one or more conductive connections 305 are generally perpendicular to the connectivity region 300 of the interconnect die 215.

The conductive connections 305 of the spacer component 225 are also coupled to one or more conductive traces 310 in a conductive trace layer 230 in the implementation shown by FIG. 3. The conductive traces 310 of the conductive trace layer 230 are generally perpendicular to the conductive connections 305 in the spacer component 225. In various implementations, the conductive connections 305 of the spacer component 225 are coupled to a first portion of the conductive traces 310 in the conductive trace layer 230.

In the implementation shown by FIG. 3, an additional interconnect die 400 has an additional connectivity region 402 that includes additional conductive pathways. A first portion of the additional interconnect die 400 is coupled to an additional spacer component 405 comprising silicon or a dielectric material without active components. The additional spacer component 305 includes additional conductive connections 407 that are generally perpendicular to the conductive traces in the conductive trace layer 230. One or more of the additional conductive connections 407 in the additional spacer component 405 are coupled to one or more of the conductive traces in the conductive trace layer 230. For example, one or more conductive connections in the spacer component 225 are coupled to conductive traces in a first portion of the conductive trace layer 230, while one or more additional conductive connections 307 in the additional spacer component 405 are coupled to conductive traces in a second portion of the conductive trace layer 230. In some implementations, the first portion of the conductive trace layer 230 is opposite the second portion of the conductive trace layer 230, with the first portion and the second portion of the conductive trace layer 230 separated by a distance.

The additional connectivity region 402 of the additional interconnect die 400 is generally perpendicular to the additional conductive connections 407 of the additional spacer component 405. One or more of the additional conductive connections 407 of the additional spacer component 405 are coupled to one or more additional conductive pathways included in the additional connectivity region 402. For example, a first portion of a front face of the additional interconnect die 400 is coupled to the additional spacer component 405 so one or more of the additional conductive connections 407 are coupled to one or more of the additional conductive pathways at the first portion of the front face of the additional interconnect die 400.

As shown in the example of FIG. 3, an additional die 410 has a front surface and a back surface that is parallel to and opposite to the front surface. The additional die 410 includes one or more additional through-die vias 415 passing from the front surface to the back surface, similar to the through-die vias 220 of the die 200 that are further described above in conjunction with FIG. 2. A portion of the back surface of the additional die 410 including the through-die vias 415 is coupled to a second portion of the front surface of the additional interconnect die 400, so one or more of the additional through-die vias 415 are coupled to one or more of the additional conductive pathways of the additional connectivity region 402 of the additional interconnect die 400. Hence, the combination of the interconnect die 215, the spacer component 225, the conductive trace layer 230, the additional spacer component 405, and the additional interconnect die 400 couple the die 200 to the additional die 410, allowing transmission of signals between the die 200 and the additional die 310. In the example shown by FIG. 3, the front surface of the additional die 410 is coupled to a surface of the mold layer 205, with an opposite surface of the mold layer 205 coupled to the substrate 210.

Figure 4:
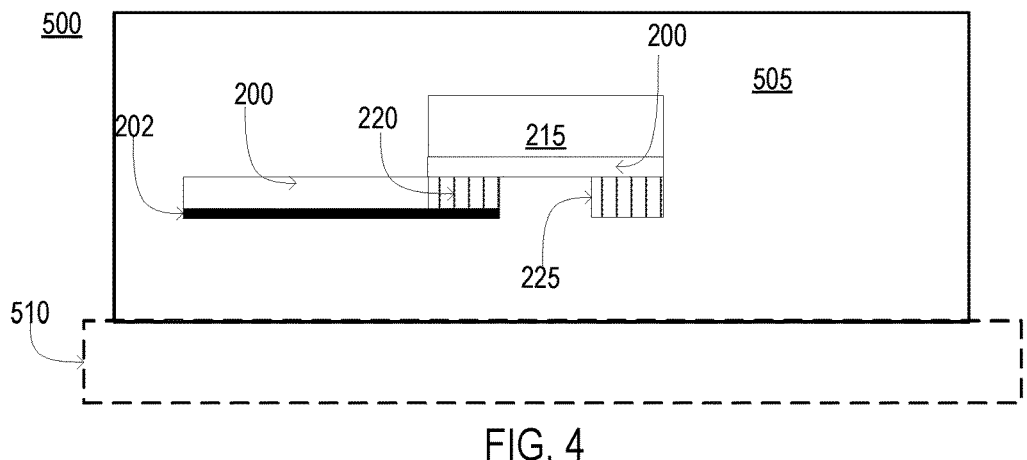
FIG. 4 is a cross-sectional diagram of an example integrated circuit device including a die that is coupled to an interconnect die that is coupled to a spacer component according to some implementations.

FIG. 4 is a cross-sectional diagram of an example integrated circuit device 500 including a die 200 that is coupled to an interconnect die 215 that is coupled to a spacer component 225 in accordance with some implementations of the present disclosure. The example integrated circuit device 500 can be implemented in a variety of computing devices, including mobile devices, personal computers, peripheral hardware components, gaming devices, set-top boxes, smart phones, and the like (as shown in FIG. 6). The example integrated circuit device 500 of FIG. 4 includes a semiconductor assembly 505 including a die 200, as further described above in conjunction with FIGS. 2 and 3. The die 200 has a front surface 204 and a back surface 206 that is parallel to and opposite to the front surface 204. One or more through-die vias 220 traverse the die 200 from the front surface to the back surface, with a first portion of a front surface of an interconnect die 215 coupled to a portion of the back surface of the die 100. The interconnect die 215 includes a connectivity region 300 having conductive pathways, with one or more of the conductive pathways coupled to one or more of the through-die vias 220 of the die 200. A spacer component 225 is coupled to a second portion of the front surface of the interconnect die 215. The spacer component 225 includes conductive connections 305 that are generally perpendicular to the connectivity region 300 of the interconnect die 215, and one or more of the conductive connections 305 are coupled to one or more conductive pathways in the connectivity region 300 of the interconnect die 215.

Figure 5:
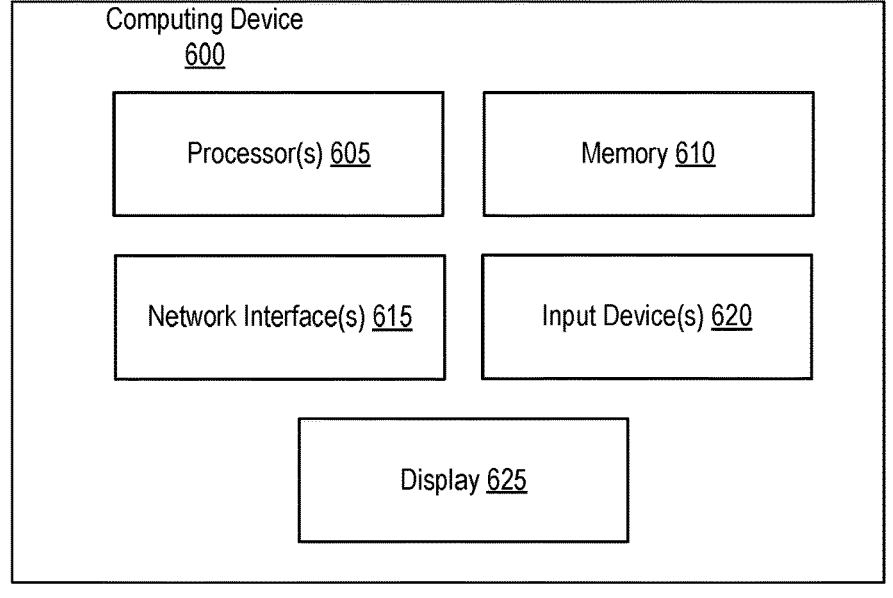
FIG. 5 is an example computing device according to some implementations.

As an example, the semiconductor assembly 505 includes one or more processors 605 of a computing device 600 as shown in FIG. 5. The computing device 600 is implemented, for example, as a desktop computer, a laptop computer, a server, a game console, a smart phone, a tablet, and the like. In addition to one or more processors 605, the computing device 600 includes memory 610. The memory 610 includes Random Access Memory (RAM) or other volatile memory. The memory 610 also includes non-volatile memory such as disk storage, solid state storage, and the like.

In some implementations, the computing device 600 also includes one or more network interfaces 615. In some implementations, the network interfaces 615 include a wired network interface 615 such as Ethernet or another wired network connection as can be appreciated. In some implementations, the network interfaces 615 include wireless network interfaces 615 such as WiFi, BLUETOOTH®, cellular, or other wireless network interfaces 615 as can be appreciated. In some implementations, the computing device 600 includes one or more input devices 620 that accept user input. Example input devices 620 include keyboards, touchpads, touch screen interfaces, and the like. One skilled in the art will appreciate that, in some implementations, the input devices 620 include peripheral devices such as external keyboards, mouses, and the like.

In some implementations, the computing device 600 includes a display 625. In some implementations, the display 625 includes an external display connected via a video or display port. In some implementations, the display 625 is housed within a housing of the computing device 600. For example, the display 625 includes a screen of a tablet, laptop, smartphone, or other mobile device. In implementations where the display 625 includes a touch screen, the display 625 also serves as an input device 620.

The semiconductor assembly 505 is coupled to a substrate 510. The substrate 510 is a portion of material that mechanically supports coupled components such as the semiconductor assembly 505. In some implementations, the substrate 510 also electrically couples various components mounted to the substrate 510 via conductive traces, tracks, pads, and the like. For example, the substrate 510 electrically couples a component of the semiconductor assembly 505 to one or more other components via a connective trace and a solder joint formed from a solder ball coupled to a conductive pad. In some implementations, the substrate 510 includes a printed circuit board (PCB), while in other implementations the substrate 510 is another semiconductor device, like semiconductor assembly 505 (which may include active components therein). In some implementations, the semiconductor assembly 505 is coupled to the substrate 510 via a socket (not shown), where the semiconductor assembly 505 is soldered to or otherwise mounted in the socket. In other implementations, as shown in FIG. 4, the semiconductor assembly 505 is directly coupled to the substrate 510 via a direct solder connection or other connection as can be appreciated. In some implementations, the semiconductor assembly 505 is coupled to the substrate 510 using a land grid array (LGA), pin grid array (PGA), or other packaging technology as can be appreciated.

For further explanation, FIG. 6 sets forth a flow chart illustrating an example method for manufacturing an integrated circuit device including a die 200 that is coupled to an interconnect die 215 that is coupled to a spacer component 225. The method shown in FIG. 6 includes coupling 605 a first portion of a connectivity region 300 of an interconnect die 215 to one or more through-die vias 220 on a back surface 206 of a die 200. The die 200 includes a front surface 204, with the back surface 206 parallel to and opposite to the front surface 204. As further described above in conjunction with FIGS. 2 and 3, the through-die vias 220 traverse from the front surface 204 to the back surface 206 of the die 200. The connectivity region 300 of the interconnect die 215 includes conductive pathways that are parallel to the die 200. One or more of the conductive pathways of the connectivity region 300 are coupled to one or more of the through-die vias 220 of the die 200 through pads for the through-die vias 220, through the through-die vias 220, or through another connection on the back surface 206 of the die 200.

Additionally, a spacer component 225 is coupled 610 to a second portion of the front surface of the interconnect die

215. The spacer component 225 includes one or more conductive connections 305 that are generally perpendicular to the conductive pathways of the connectivity region 300 of the interconnect die 215, and the spacer component 225 is coupled 610 to the second portion of the front surface of the interconnect die 215 so one or more of the conductive connections 305 are coupled to the conductive pathways of the connectivity region 300 of the interconnect die 215, as further described above in conjunction with FIGS. 2 and 3.

Optionally, the method further couples 615 the connective connections 305 of the spacer component 225 to one or more conductive traces 310 that are generally perpendicular to the conductive connections 305. As further described above in conjunction with FIGS. 2 and 3, in some implementations the one or more conductive traces 310 are included in a conductive trace layer 230 that comprises a dielectric material without at least one active component; in other implementations, the conductive trace layer 230 includes one or more active components. This allows the spacer component 225 to compensate for a difference in height between the front surface of the interconnect die 215 and a surface, such as a topmost surface, of the one or more conductive traces 310 to connect the interconnect die 215 to the one or more conductive traces 310, as further described above in conjunction with FIG. 2. In various implementations, a thickness of the spacer component 225 is based on a distance between the front surface of the interconnect die 215 and a topmost surface of the one or more conductive traces 310. For example, the thickness of the spacer component 225 equals the distance between the front surface of the interconnect die 215 and the topmost surface of the one or more conductive traces 310. In another example, the thickness of the spacer component 225 is within a threshold amount of the between the front surface of the interconnect die 215 and the topmost surface of the one or more conductive traces 310.

In some implementations where the conductive connections 305 of the spacer component 225 are coupled 615 to the one or more conductive traces 310 that are generally perpendicular to the conductive connections 305, a component 235 is also coupled to one or more of the conductive traces 310. In some implementations, the component is a memory, such as a high bandwidth memory. The component 235 is coupled to an end of the one or more conductive traces 310 that is opposite to an additional end of the one or more conductive traces 310 to which the conductive connections 305 of the spacer component 225 are coupled. In some implementations, the component is an additional spacer component 405 that includes additional conductive connections, so one or more of the additional conductive connections are coupled to the one or more conductive traces 310. An additional interconnect die 400 having an additional connectivity region that includes additional conductive pathways is coupled to the additional spacer component 405 so one or more of the additional conductive pathways are coupled to the additional conductive connections in the additional spacer component 405 in some implementations. The additional conductive pathways are generally perpendicular to the additional conductive connections. In some implementations, an additional die 410 having an additional front surface and an additional back surface parallel to and opposite to the additional front surface that includes one or more additional through-die vias 415 is coupled to the additional spacer component 405 so one or more of the through-die vias 415 in a portion of the additional back surface of the additional die 410 are coupled to one or more of the additional conductive pathways of the additional connectivity region of the additional interconnect die 300.

In view of the explanations set forth above, readers will recognize that manufacturing a semiconductor assembly including a die that is coupled to an interconnect die that is coupled to a spacer component allows the die to be coupled to another component having a different height than the die or to another component having differing temperature constraints than the die. Additionally, coupling the die to the interconnect die that is coupled to the spacer component simplifies connection of the die to other components when the semiconductor assembly is a stacked semiconductor assembly by including interconnect die during fabrication of the semiconductor assembly. Further, coupling a back surface of the die to an interconnect die that is coupled to a spacer component allows the front surface of the die to remain unobstructed, simplifying delivery of power, ground, or other signals to the front surface of the die.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A semiconductor assembly comprising:
a die having a front surface and a back surface opposite to and parallel to the front surface;
an interconnect die, where a first portion of a front surface of the interconnect die is coupled to a portion of the back surface of the die and the interconnect die including a connectivity region having conductive pathways and the connectivity region coupled to one or more through-die vias in the die through the back surface of the die;
a conductive trace layer comprising a plurality of conductive traces included in a dielectric material, the plurality of conductive traces perpendicular to the conductive connections of a spacer component and coupled to one or more of conductive connections of the spacer component; and
the spacer component is separate from the die and coupled to a second portion of the front surface of the interconnect die,
the spacer component including one or more conductive connections coupled to one or more of the conductive pathways of the connectivity region of the interconnect die, wherein
the spacer component has a thickness that is substantially the same as a distance between the front surface of the interconnect die and a topmost surface of the plurality of conductive traces.

2. The semiconductor assembly of claim 1, wherein the conductive trace layer does not include at least one active component.

3. The semiconductor assembly of claim 1, further comprising:
a component coupled to at least a set of the plurality of conductive traces.

4. The semiconductor assembly of claim 3, wherein the component comprises a memory.

5. The semiconductor assembly of claim 1, further comprising:
an additional spacer component including additional conductive connections perpendicular to the plurality of conductive traces, one or more of the additional conductive connections coupled to one or more conductive traces of the plurality of conductive traces; and an additional interconnect die having an additional connectivity region including additional conductive pathways perpendicular to the additional conductive connections, one or more of the additional conductive pathways coupled to one or more of the additional conductive connections.

6. The semiconductor assembly of claim 5, further comprising:

an additional die having an additional front surface and an additional back surface parallel to and opposite to the additional front surface, one or more additional through-die vias in the additional die coupling a portion of the additional back surface to one or more of the additional conductive pathways of the additional connectivity region of the additional interconnect die.

7. The semiconductor assembly of claim 1, wherein the conductive connections comprise through silicon vias.

8. The semiconductor assembly of claim 1, wherein the interconnect die is hybrid bonded to the die.

9. The semiconductor assembly of claim 1, wherein the spacer component comprises a dielectric material.

10. The semiconductor assembly of claim 9, wherein the spacer component does not include at least one active component.

11. The semiconductor assembly of claim 1, wherein the front surface of the die is configured to be coupled to a substrate and the front surface of the die is not partially obstructed by the interconnect die.

12. The semiconductor assembly of claim 1, further comprising:

an additional die having an additional front surface and an additional back surface parallel to and opposite to the additional front surface; and an additional spacer component contacting the additional back surface of the additional die and one or more conductive portions of the additional die coupled to one or more of conductive connections of the additional spacer component.

13. The semiconductor assembly of claim 12, wherein the additional die has a height less than a height of the die.

14. The semiconductor assembly of claim 12, wherein the additional die has a different temperature constraint than the die.

15. A method comprising:

coupling a first portion of a connectivity region of a front surface of an interconnect die to one or more through-die vias on a back surface of a die, the back surface of the die opposite to and parallel to a front surface of the die, the connectivity region having conductive pathways; and coupling a spacer component to a second portion of the front surface of the interconnect die, the spacer component including conductive connections, one or more of which are coupled to one or more of the conductive pathways of the connectivity region of the interconnect die; and coupling one or more of the conductive connections of the spacer component to a plurality of conductive traces included in a conductive trace layer, the plurality of conductive traces included in a dielectric material and are perpendicular to the conductive connections, wherein the spacer component has a thickness that is substantially the same as a distance between the front surface of the interconnect die and a topmost surface of the plurality of conductive traces.

16. The method of claim 15, further comprising: coupling a component to at least a set of the conductive traces.

17. The method of claim 15, wherein the spacer component has a thickness based on a distance between the front surface of the interconnect die and a surface of the plurality of conductive traces.

* * * * *